(12) United States Patent
Tzeng et al.

(10) Patent No.: US 6,294,474 B1
(45) Date of Patent: Sep. 25, 2001

(54) PROCESS FOR CONTROLLING OXIDE THICKNESS OVER A FUSIBLE LINK USING TRANSIENT ETCH STOPS

(75) Inventors: Wen-Tsing Tzeng, Taichung; Yue-Feng Chen, Hsinchu; Kau-Jan Wang, Chia-I, all of (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/425,906

(22) Filed: Oct. 25, 1999

(51) Int. Cl.[7] ................ H01L 21/302; H01L 21/461
(52) U.S. Cl. .................... 438/710; 438/600; 438/601
(58) Field of Search .................... 438/600, 601, 438/710

(56) References Cited

U.S. PATENT DOCUMENTS

| | | | |
|---|---|---|---|
| 5,235,205 | 8/1993 | Lippitt, III | 257/528 |
| 5,241,212 | 8/1993 | Motonami et al. | 257/529 |
| 5,567,643 | 10/1996 | Lee et al. | 437/60 |
| 5,618,750 | 4/1997 | Fukuhara et al. | 438/601 |
| 5,789,795 | 8/1998 | Sanchez et al. | 257/530 |
| 5,821,160 | 10/1998 | Rodriguez et al. | 438/601 |

OTHER PUBLICATIONS

Wolf, "Silicon Processing for the VLSI Era", vol.2: Process Integration, Lattice Press, Sunset Beach, CA, (1990), p. 598–599.

Wolf, "Silicon Processing for the VLSI Era", vol.3: The Submicron MOSFET, Lattice Press, Sunset Beach, CA, (1995), p. 275.

*Primary Examiner*—Felisa Hiteshew
(74) *Attorney, Agent, or Firm*—George O. Saile; Stephen B. Ackerman

(57) ABSTRACT

A method is described for progressively forming a fuse access opening for laser trimming in an integrated circuit with improved control of dielectric thickness over the fuse. A dielectric layer is formed over the fuse and a polysilicon layer is then patterned over the fuse to form a first etch stop. An ILD layer is added and a second etch stop is formed in a first metal layer on the ILD layer over the first etch stop. The second etch stop serves to protect the ILD layer over the fuse from being etched by an ARC over etch during the via etching in a first IMD layer. A first portion of the laser access window is formed during the via etching of the first IMD layer. The second etch stop is then removed by the second metal patterning etch, exposing the ILD layer over the first etch stop at it's original thickness. A passivation layer is deposited and patterned to form access openings to bonding pads as well as to further open the laser access window to the first etch stop. The first etch stop prevents penetration of the subjacent insulative layer over the fuse, thereby maintaining a controlled uniform thickness of that layer. When the bonding pads are opened, including the removal of an ARC on their surface, the etchant conditions are changed to remove the etch stop and subsequently a portion of the subjacent insulative layer over the fuse leaving a precise and uniform thickness of dielectric material over the fuse. The process fits conveniently within the framework of an existing process and does not introduce any additional steps.

13 Claims, 6 Drawing Sheets

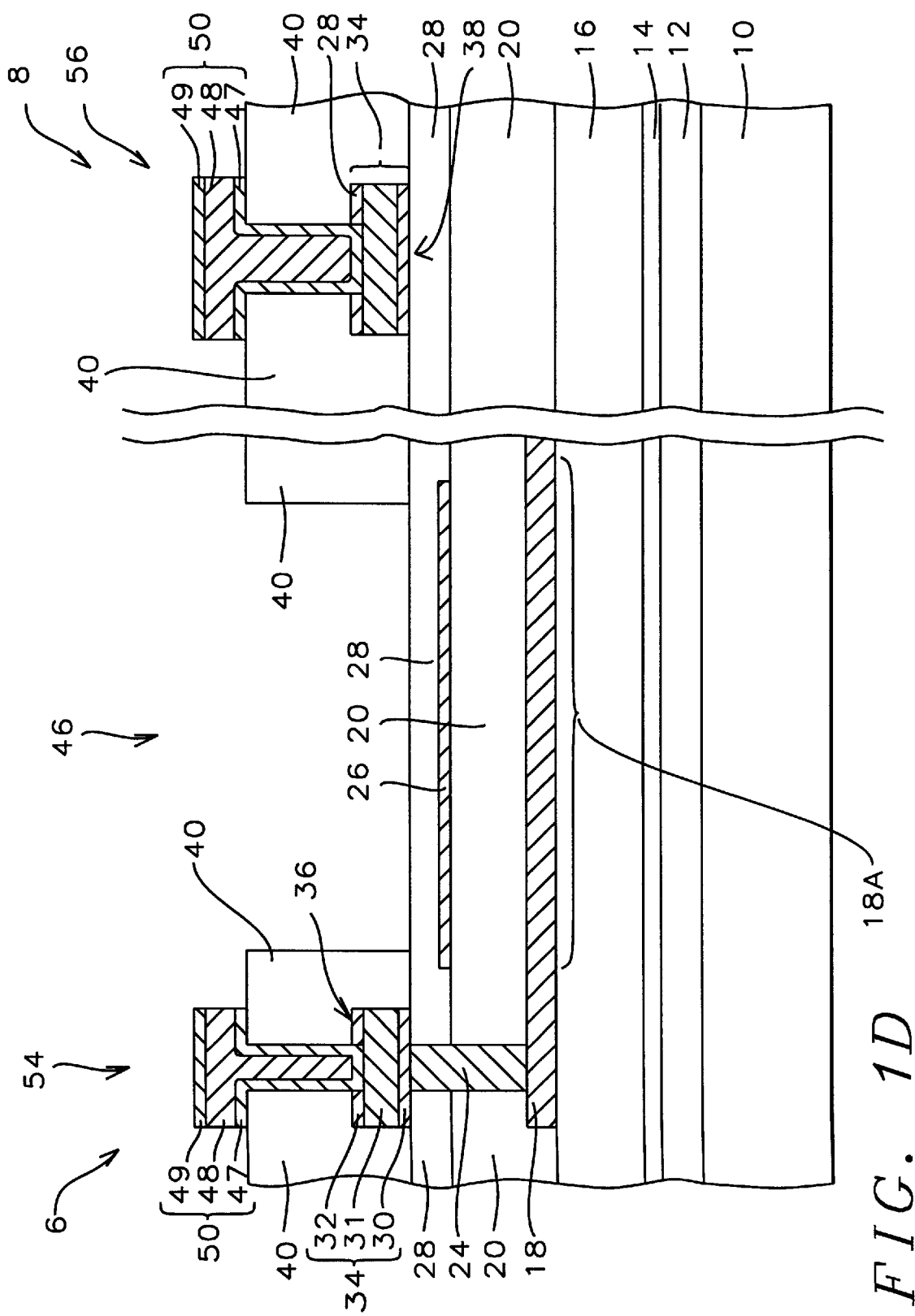

PROCESS FOR CONTROLLING OXIDE THICKNESS OVER A FUSIBLE LINK USING TRANSIENT ETCH STOPS

RELATED PATENT APPLICATION

VIS-87-128, Ser. No. 09/354852, F/D Jul. 29, 1999, "A PASSIVATION LAYER ETCHING PROCESS FOR MEMORY ARRAYS WITH FUSIBLE LINKS", W. T. Tzeng, assigned to a common assignee.

BACKGROUND OF THE INVENTION

(1) Field of the Invention

The invention relates to processes for the manufacture of semiconductor devices and more particularly to processes for manufacturing memory arrays with fusible links.

(2) Description of prior art

Computer memory chips consist of vast arrays of storage cells which can be addressed by wordlines and bitlines. Each cell corresponds to one bit. The most commonly used cell design used in current dynamic random access memories (DRAMs) comprise a transfer gate(usually an MOS field-effect-transistor(MOSFET) and a storage node consisting of a capacitor. DRAM cells are, by necessity of high density and of simple design. To this end, the MOSFET-capacitor combination serves quite well. Static-random-access-memories(SRAMs) are slightly more complex, requiring four to six MOSFETs per cell.

The cell quantity requirements for memory are increasing at a phenomenal rate. Whereas the SRAMs of 1991 were of the order of 4 megabits, the density by the year 2001 is predicted to be 256 megabits or more. DRAMs have even greater cell density requirements. See e.g. S. Wolf, "Silicon Processing for the VLSI Era", Vol. II, Lattice Press, Sunset Beach, Calif. (1990) p.598ff, and Vol. III(1995) p.275. The occurrence of a single defect in such a complex integrated circuit(IC) renders the entire body useless.

Obviously, the manufacturing functional yield of memory chips would rapidly approach zero if steps were not taken to circumvent such defective components. To this end, additional segments of memory circuits are provided on the IC chip as replacements for defective segments. Fortunately, memory arrays, by virtue of their repetitive design, lend themselves particularly well to the incorporation of such redundant segments. Although, additional space is required for these extra circuits, the yield benefits they provide make them very cost effective.

The manner in which these redundant segments are utilized and defective segments deleted is accomplished by means of laser trimming. A description of the design layout and implementation of such redundant circuits need not be given here but may be found in Motonami et.al., U.S. Pat. No. 5,241,212. The segments are provided with fusible links or fuses which are ruptured or blown as required, by a laser, after IC processing has been completed and functional testing with probes is possible. The functional testing determines which segments are defective and a laser, usually a neodymium YAG laser, is directed at the appropriate fusible links, thereby breaking the circuit.

The fusible links are formed as part of one of the metallization layers of the IC. Typically, a lower level, such as a polysilicon level is used. This level would, for example, contain the word-lines of a DRAM array. Prior to Laser trimming, the interlevel dielectric layers above the fusible link are sometimes removed entirely and replaced by a thinner protective layer to provide a short uniform path for the laser and confine the resultant debris. In other cases, the thick dielectric layers are etched down to a pre-determined thickness above the link. The laser energy required to blow the fuse is proportional to the thickness of the dielectric material above the fuse. It is therefore desirable to have close control over the thickness and uniformity of the dielectric layer over the laser access window.

The laser access window is commonly opened in a final etch step after the uppermost metallization level has been patterned and a final passivation layer has been deposited. The passivation layer is patterned to form access openings to bonding pads in the uppermost metallization level and, simultaneously form access openings to the fuses. At the bonding pads, the etch must penetrate the passivation layer, which is between about 0.5 and 1.5 microns thick, and a 200 to 400 Angstrom thick ARC (anti-reflective coating) on the pad. However, the fuse openings must not only pass through, the passivation layer, but an additional thickness of subjacent insulative layers varying between about 0.8 and 1.4 microns. Even though etch rate selectivities favorable for etching insulative material over metallization are used, it is difficult to etch the entire fuse opening simultaneously with the bonding pad openings without either degrading the bonding pad by over etching, or leaving too much or too little or no insulator over the fuses.

In current technology, the ARC over the bonding pads must also be removed by the passivation layer patterning step. This requires significant over-etching of the bonding pad and often results in excessive or total removal of insulative layer over the fuses. Exposure of the fuses subjects them to atmospheric moisture and corrosion. It is therefore desirable to have a method of opening fuse access windows which can overcome cumulative thickness non-uniformities of the insulative layer over the fusible links and leave a uniform and reproducible target dielectric thickness over them at the end of the process.

Rodriguez, et.al., U.S. Pat. No. 5,821,160 addresses the problem of cumulative non-uniformities in an SRAM (static random access memory) developed in the multiple insulative layers between the fuses an the passivation layer by providing an etch stop in a polysilicon layer which lies just one insulative layer above the fuses. The polysilicon layer which used to form the poly load resistors of the SRAMs is patterned to include plates of polysilicon over the fuse regions. These plates are located on a layer of about 4,000 Angstroms of silicon oxide which is formed directly on the fuses. The plates serve as an etch stop during the fuse opening etch so that a uniform oxide layer remains over the fuses. Although this procedure assures a uniform thickness of insulator over the fuses, a large etch depth differential between the bonding pad openings and the fuse access openings still remains.

Lippitt, U.S. Pat. No. 5,235,205, like Rodriguez provides an etch stop, patterned in a metallization level over a fuse, to permit the opening both bonding pads completely and fuse access openings to a fixed level without using a time dependent etch. However, in both instances, unless the etch stop material can be subsequently etched selectively while the bonding pads are exposed, the etch stop cannot be removed without using an additional photomask to protect the bonding pads. This requirement, in order to save a photolithographic step is not a welcome design limitation.

Fukuhara, et.al., U.S. Pat. No. 5,618,750 shows methods for forming fuse structures which have non-corrosive elements to prevent corrosion damage to surrounding components after the fuse is blown. Lee, et.al., U.S. Pat. No.

5,567,643 describes a guard ring structure around a fuse which protects nearby components from corrosion damage after the fuse is blown. Sanchez, et.al., U.S. Pat. No. 5,789,795 shows the shows the formation of an anti-fuse wherein a dielectric etch stop layer is deposited directly on the layer of anti-fuse material.

SUMMARY OF THE INVENTION

It is an object of this invention to provide a method for forming a laser access opening to a fusible link with a uniform and controllable thickness of dielectric over the link within the opening.

It is another object of this invention to provide a method for limiting the depth of a fusible link access opening during via formation in a passivation layer by the use of a transient etch stop.

It is another object of this invention to provide a method for improving the uniformity of insulative layers over a fusible link while at the same time sufficiently over-etching vias in a passivation layer to thoroughly remove ARC layers from subjacent metallization.

It is yet another object of this invention to provide a method for patterning a passivation layer to form access to bonding pads and laser access openings with a single photolithographic mask.

These objects are accomplished by etching the laser access opening in two steps using transient etch stop layers to limit the depth of the access opening after the first step and finishing the opening in the second step. After a fuse is formed in a polysilicon level, a primary etch stop pad is patterned in the next higher polysilicon level over the rupture zone of the fuse. Insulative layers and metallization layers are deposited over the etch stop pad during subsequent processing. An ILD (inter-level-dielectric) layer and a first metallization layer are deposited over the primary etch stop pad. The first metallization layer is patterned to define a first level wiring pattern. In addition, a portion of the first metallization layer is retained to form a secondary etch stop pad concentrically over the primary etch stop pad. The secondary etch stop pad protects the underlying ILD layer from being thinned by the via over-etch which is used to remove the ARC at the base of the vias. Formation of a laser access window over the fuse region is begun during the first via etch and completed by the passivation layer etch step concurrent with the etching of bonding pad vias. The entire etching process is performed in a plasma or RIE (reactive ion etching) etching tool, in successive stages wherein the etchant gas mixture and the etching parameters are altered in-situ. Over the bonding pads, the etch penetrates the components of the passivation layer as well as an ARC on the pad.

Removal of the ARC requires considerable over etching of the vias. During the over-etch period, etching of the fuse access opening continues to form through the remaining portion of the ILD layer and stops on the polysilicon etch stop pad. The polysilicon etch stop pad is next removed by altering the etchant gas and adjusting the oxide-to-polysilicon etching selectivity. Finally, the dielectric layer over the fusible link is controllably etched to the desired thickness. The bonding pad via openings and the final fuse access opening can be accomplished by a single mask. The invention may be accomplished in an existing process without introducing additional processing steps.

BRIEF DESCRIPTION OF THE DRAWINGS

FIG. 1A through FIG. 1F are cross sections of portions of a DRAM integrated circuit showing the process steps for forming a fuse access window according to an embodiment of this invention.

DESCRIPTION OF THE PREFERRED EMBODIMENTS

Figure 1A:
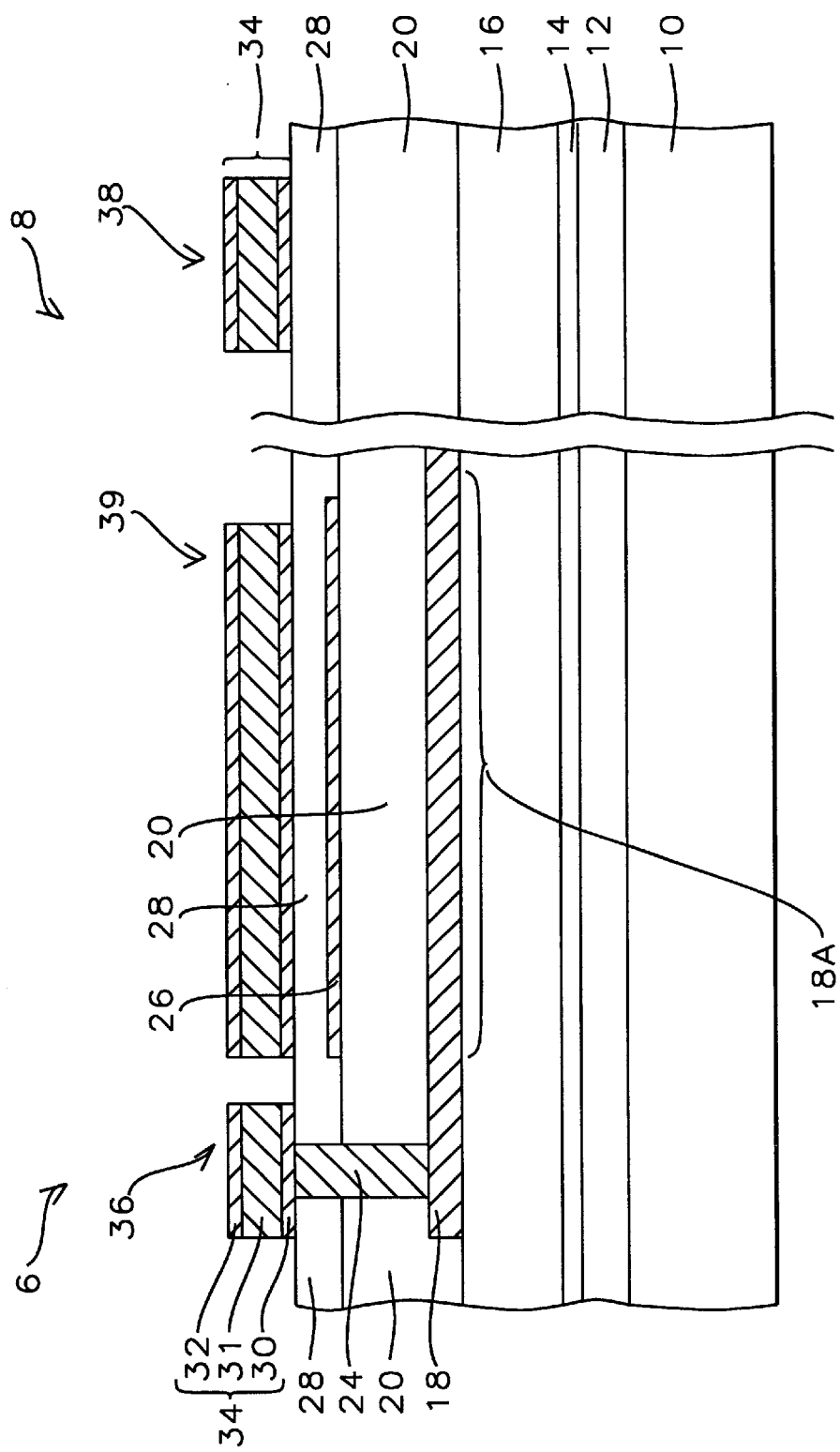

In an embodiment of this invention an etch stop is formed in a polysilicon layer which is superjacent to a polysilicon fuse. Referring to FIG. 1A, a p-type <100> oriented monocrystalline silicon wafer 10 is provided. The wafer 10 is processed using conventional manufacturing procedures for the incorporation of semiconductor devices (not shown).

A field oxide 12 is formed to isolate the semiconductor devices and is present below a region wherein a fusible link (fuse) is to be formed. The field oxide 12 is formed by the well known LOCOS (local oxidation of silicon) to a thickness of 2,500 Angstroms or thereabout. FIG. 1A shows cross sections of a region 6 which is a fuse region and another region 8 in which a bonding pad will later be formed. The circuit design chosen for this embodiment comprises a DRAM array having one or more redundant segments in a region adjacent to the primary memory array. Elements of the DRAM integrated circuit are concurrently formed elsewhere on the wafer. These elements will be referred to but are not shown in the figures. Fuses are provided for each replaceable segment in the primary array and fuses to insert redundant segments are similarly provided. In FIG. 1A a fuse 18 is patterned in a second polysilicon layer of the DRAM process. This is the polysilicon layer in which the bitlines in the DRAM cell array are also patterned. The section 18A of the fuse 18 is designated as the region over which an access window will be formed in subsequent processing, allowing a laser beam to cause an open in the fuse.

A silicon oxide layer 14 is formed over the field oxide layer 12. The layer 14 is formed by the well known CVD (chemical vapor deposition) of TEOS (tetraethoxyorthosilicate) to a thickness of between about 800 and 1,100 Angstroms. In the DRAM cell the TEOS silicon oxide layer 14 covers the patterned wordlines.

A BPSG layer 16, having a thickness of 5,000 Angstroms or thereabout is deposited, preferably by PECVD (plasma enhanced CVD), on the silicon oxide layer 14. Together, the BPSG layer 16 and the oxide layer 14 form a first IPO (inter polysilicon oxide) layer. BPSG layer 16 is planarized by CMP (chemical mechanical polishing) and openings (not shown) for the bitline contacts are then etched in the layer.

A layer of in-situ doped polysilicon is blanket deposited over the wafer and patterned to form the bitlines in the cell array and simultaneously, the fuse element 18 in the region 6. A silicon oxide layer 20, referred to as a C2 oxide is deposited over the polysilicon fuse 18 by PECVD. The C2 oxide layer 20 forms the base upon which the broadened or crown portion of the DRAM cell storage capacitor is built in the cell array. The thickness of the C2 oxide layer 20 is between about 0.4 and 0.5 microns.

A polysilicon layer, referred to as the P4 polysilicon layer in the DRAM terminology, is next deposited over the C2 oxide 20 and patterned to form the upper cell plate of the storage capacitors in the DRAM array and concurrently, a plate 26 over the fuse 18 in the region 6. The P4 polysilicon plate 26 covers a region where an opening is to be formed to permit access by a laser trimming tool. In subsequent processing, the plate 26 will perform as an etch stop to prevent etching of the subjacent C2 insulative layer 20 over the fuse 18 during subsequent passivation layer patterning. An ILD layer 28 is deposited over the C2 oxide 20 and the P4 etch stop plate 26. The ILD layer 28 is formed of BPSG and is deposited by PECVD to a thickness of between about 3,500 and 4,500 Angstroms. The ILD layer 28 is planarized after deposition, preferably by CMP.

A conductive plug 24 is formed through the ILD layer 28 and the C2 oxide 20, contacting the fuse element 18 whereby the fuse element is connected to a portion of the integrated circuit which is to be fused. The conductive plug 24 is preferably a tungsten plug although another conductive material may be used. Methods for forming interlevel conductive plugs are well known. A second connection (not shown) to the fuse 18 is made elsewhere, on the opposite side of the rupture zone 18A from the connection 24, to a second portion of the integrated circuit so that, if the fuse is ruptured in the fusible region 18A, an open will occur between the two portions.

A first metallization level 34 is next deposited on ILD layer 28. A Ti/TiN adhesion/barrier layer 30 is deposited, preferably by sputtering. Ti/TiN adhesion/barrier layers are well known and typically applied at the base of the metallization layer. The adhesion/barrier layer 30 is between about 200 and 300 Angstroms thick overall. A metal layer 31 consisting of an aluminum alloy is deposited on the adhesion/barrier layer 30 to a thickness of between about 4,000 and 6,000 Angstroms. Alternately, other conductive materials may be used to form the metal layer 31, for example aluminum, tungsten, copper, a tungsten alloy or a copper alloy. The metal layer 31 is deposited by a PVD (physical vapor deposition) method such as sputtering or vacuum evaporation. Alternately a MOCVD (metal organic CVD) deposition may be employed.

An ARC 32 is deposited over the metal layer 31 to reduce reflections from the metal surface during photo patterning. The ARC 32 comprises a layer of TiN between about 200 and 400 Angstroms thick deposited by sputtering. Alternately, the ARC may comprise TaN or silicon oxynitride. The first metallization layer 34, which comprises the adhesion/barrier layer 30, the main aluminum alloy conductive layer 31 and the ARC 32 is patterned by conventional photolithographic methods to form a connection 36 to the conductive plug 24, and a section of metallization 38 in the region 8.which will form a connection from first metal wiring to a bonding pad. In addition, a portion 39 of the first metallization layer 34 is retained to form a secondary etch stop pad concentrically over the primary etch stop pad.

Figure 1B:
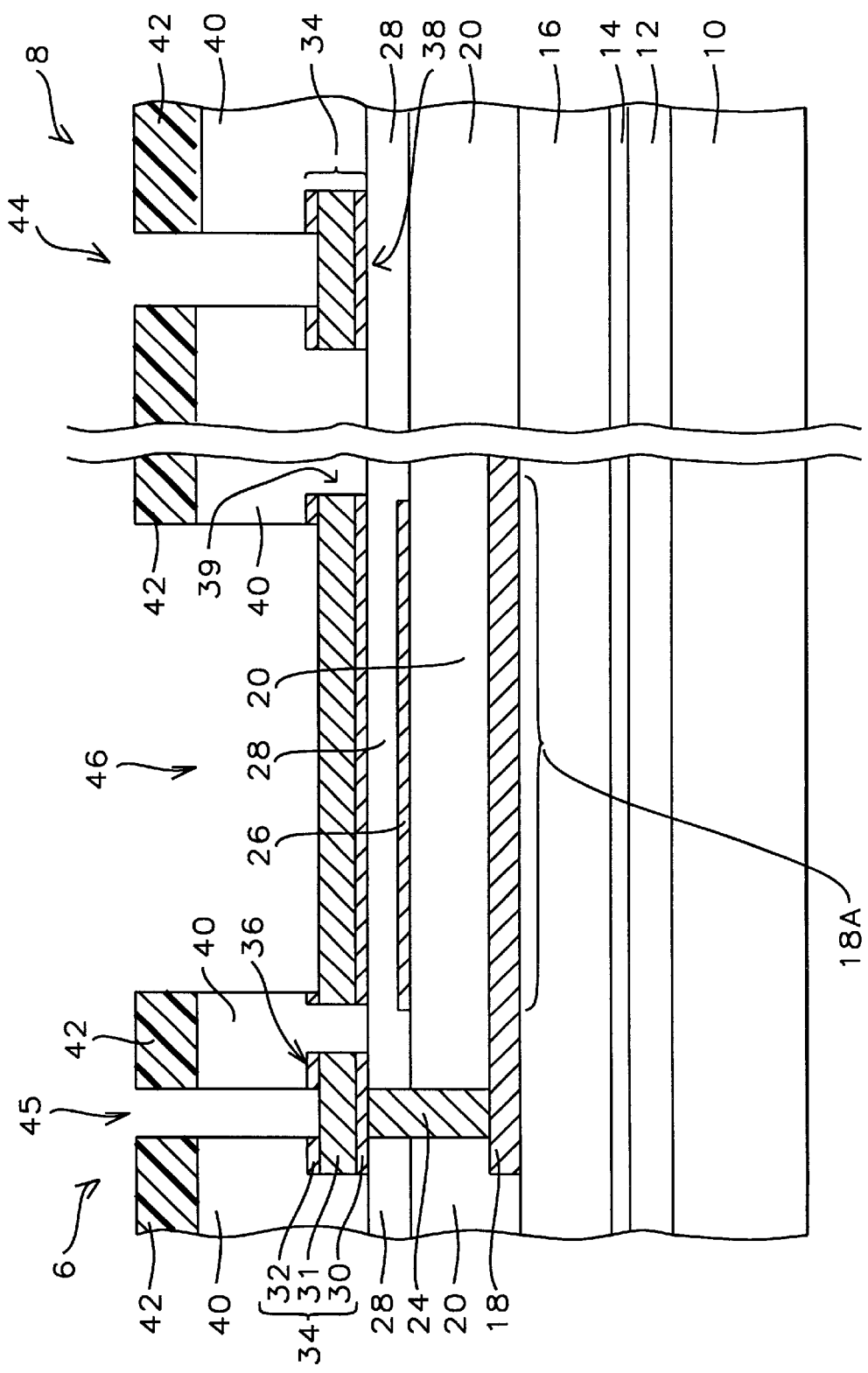

Referring to FIG. 1B, an IMD (inter-metal-dielectric) layer 40 between about 0.8 and 1.3 microns thick is deposited over the first level metallization pattern 36, 38, 39. The IMD layer 40 is formed of a TEOS silicon oxide deposited by PECVD. The IMD layer 40 is planarized after deposition, preferably by CMP. Alternately, a spin-on-glass planarization method may be used.

Photoresist 42 is patterned on the IMD layer 40 and via openings 44, 45 are anisotropically etched to the wiring connection 36 and to the bonding pad connection 98. In addition, a first portion of a fuse access opening 46 is etched concurrently, penetrating the ARC 32 and stopping on the aluminum layer 31. Anisotropic etching of the IMD layer 40 is accomplished by well known plasma etching or by RIE using etchant gases containing fluorocarbons. The via openings 44, 45 are over-etched by approximately 100 percent in order to remove the ARC 32 at the base of the openings. The fuse access opening 46 is now partially formed. The secondary etch stop pad 39 protects the subjacent ILD layer 28 over the fuse region during the ARC over-etch period. Without this etch stop protection, a significant portion of the ILD layer 28 would be lost during the first via ARC over-etch.

Figure 1C:
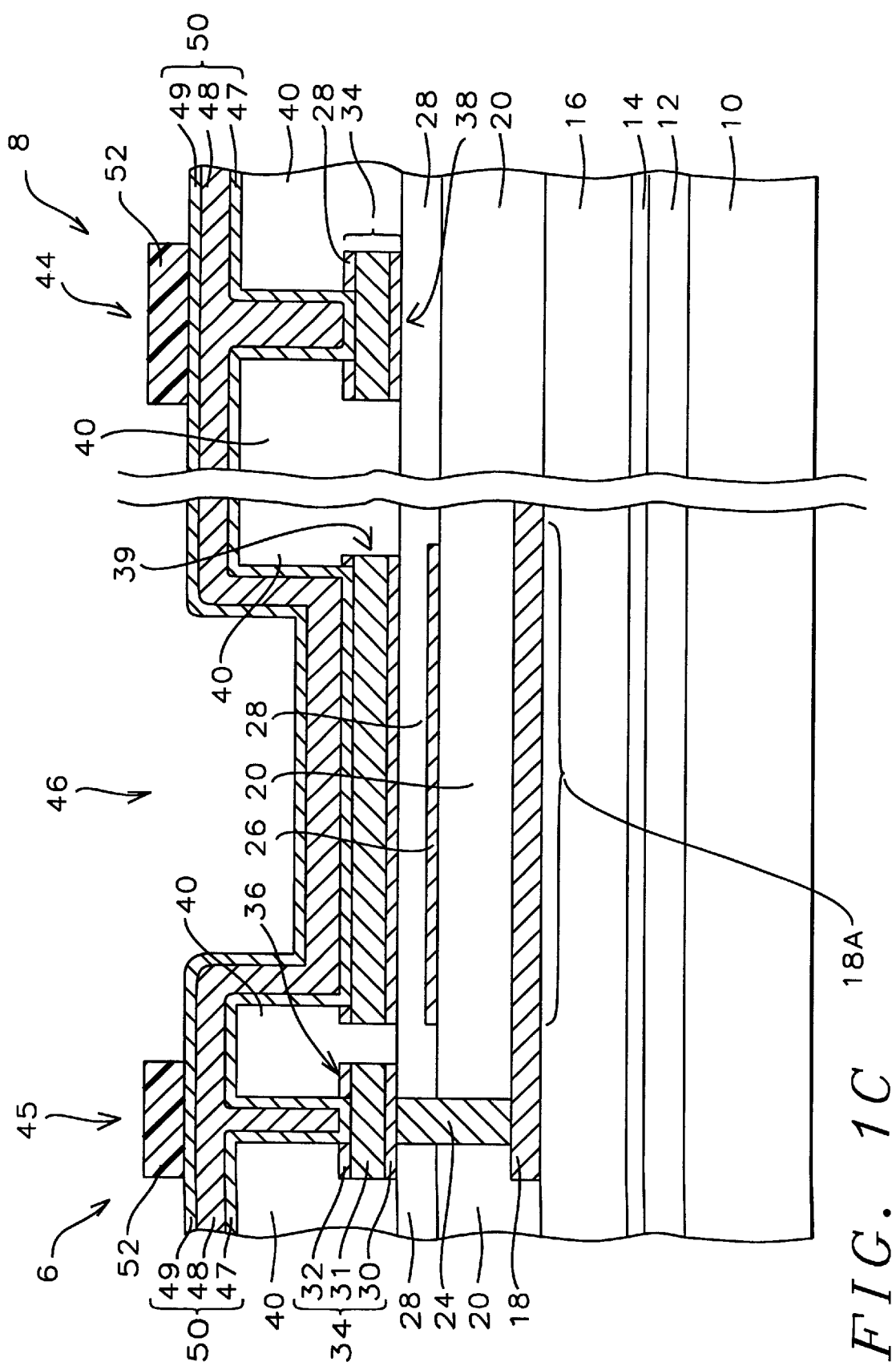

Referring to FIG. 1C, after stripping residual photoresist 42, a second metal layer 50 is deposited over the wafer 10 filling the vias 44 and 45 and into the access opening 46. The second metal layer 50 is formed in a like manner to the first metal layer 34, being comprised of an adhesion/barrier layer 47 of Ti/TiN, between about 200 and 400 Angstroms thick, deposited by sputtering; an aluminum alloy layer 48, between about 0.4 and 0.9 microns thick, deposited by PVD or MOCVD; and an ARC 49 of TiN, between about 200 and 500 Angstroms thick, deposited by sputtering. Alternately, the ARC 49 may be formed of TaN or silicon oxynitride. Alternately, another conductive material may be used to form the conductive layer 48, for example aluminum, tungsten, copper, a tungsten alloy or a copper alloy.

Photoresist 52 is applied over the metallization layer 50 and patterned to define a bonding pad in the region 8 and an interconnection line in the region 6. Referring to FIG. 1D the second metallization layer 50 is patterned by anisotropic etching to form an interconnect line 54 and a bonding pad 56. The anisotropic etching is accomplished by plasma etching in a plasma containing $Cl_2$. A high metal-to-silicon oxide etch rate selectivity is chosen by selection of the etching parameters and etch gas composition. These procedures are well known by those in the art. All metallization, including the secondary etch stop 39 which has performed it's function, is now removed within the fuse access opening 46.

Figure 1E:
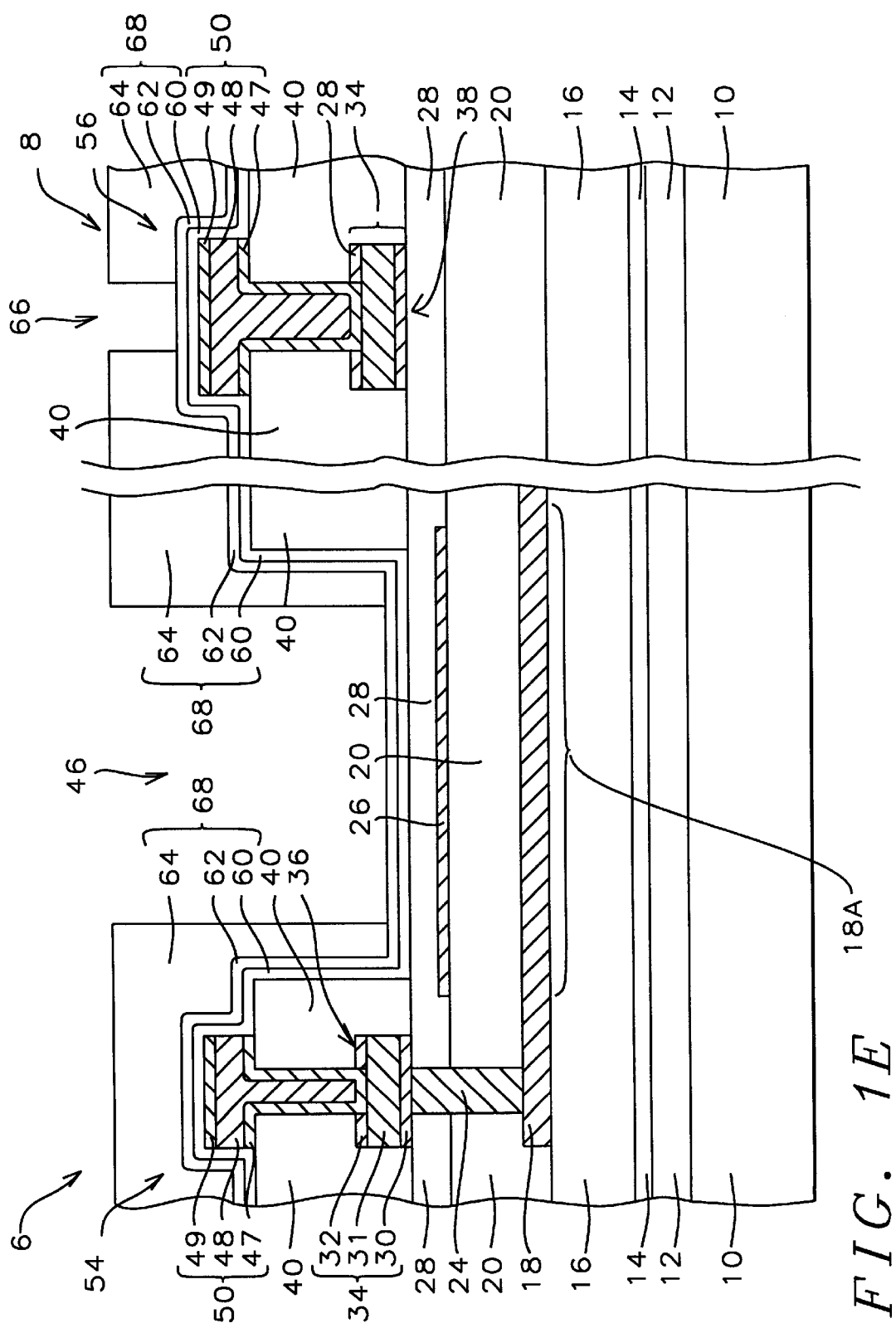

Referring to FIG. 1E, a silicon oxide layer 60 between about 0.4 and 0.7 microns thick is deposited over the wafer. A silicon nitride layer 62, between about 0.4 and 0.7 microns thick is deposited on the silicon oxide layer 60. Finally, a photosensitive polyimide layer 64 is deposited over the silicon nitride layer and patterned to expose the silicon nitride layer 62 in the fuse access opening 46 and an opening 66 over the bonding pad 56. The polyimide layer 64 is deposited to a thickness between about 8 and 12 microns by a spin-on process which is a well known photolithographic process. The passivation layer 68 comprises the silicon oxide layer 60, the silicon nitride layer 62 and the polyimide layer 64. Alternately the passivation layer 68 may take another form. For example the polyimide layer 64 may be omitted or replaced by a PSG (phosphosilicate glass) layer. Conventional photoresist is then used to pattern the layer.

Figure 1F:
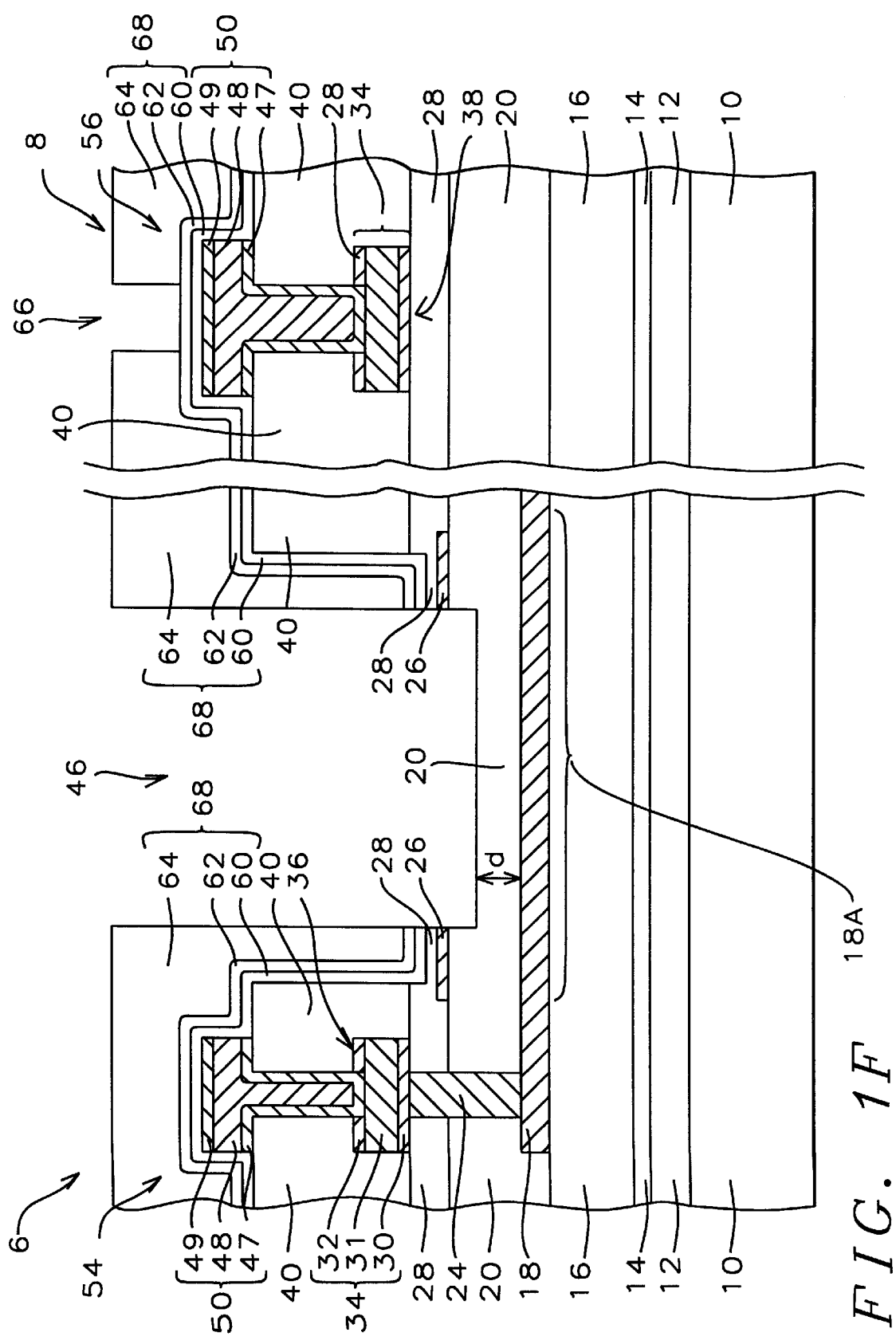

Referring to FIG. 1F, the photo patterned polyimide layer 64 is used as a mask to further pattern the passivation layer 68. The silicon nitride 62 and the silicon oxide 60 components of the passivation layer 68 are sequentially etched in an anisotropic plasma etching tool by conventional plasma etching or RIE methods, using etchant gases containing fluorocarbons, to expose the ILD oxide 28 in the laser access opening 46 and the ARC 49 on the bonding pad 56. After the etchant completes penetration of the passivation layer 68, etching is continued for time period to thoroughly penetrate the TiN ARC 49 on the bonding pad 56.exposing the subjacent metal 48 underneath. During this period the etching parameters are adjusted to achieve an $Si:SiO_2$ etch rate selectivity of about 7:1. It is essential that the TiN ARC 49 be completely removed in order to assure a good wire bonding connection. During the time wherein the ARC is being etched, the ILD layer 28 in the access opening 46 etches further until it is halted by the etch stop pad 26. The etch stop pad 26 provides a wide processing window allowing a more than sufficient ARC etching without penetration of the ILD layer 28.

After the etching of the ARC 49 on the bonding pad 56 is completed, $SF_6$ is added to the etchant gas and the etching parameters are adjusted to obtain a $Si:SiO_2$ etch rate selectivity of about 1:1. The etch stop pad 26 is now etched away in the opening 46 and the subjacent ILD layer is etched to a target thickness "d" preferably between about 0.2 and 0.5 microns and more preferably about 0.35 microns. The entire passivation layer etch, ARC removal and the reduction of the ILD layer 28 over the fusible region 18A to a uniform target thickness is accomplished in a single operation (pumpdown) of the etching tool.

The embodiments uses a p-type substrate. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein the semiconductor devices are incorporated.

While the preferred embodiment describes the use of fuses formed in a first layer of polysilicon where they address word lines in a DRAM array, it should be understood that such fuses are also applicable under the scope of this invention which may be formed within other circuit levels. Similarly, while the embodiments describe two metallization levels with a single IMD, it should be likewise understood that the invention may address additional metallization levels with additional insulative layers. These additional insulative layers or portions thereof may be accumulated over the fuse opening etch stop pad, thereby leaving a thickness of insulative material between the etch stop pad and the passivation layer.

Additionally, while this embodiment addresses laser trimming in a DRAM array, the applicability of this invention may be extended to other types of integrated circuits. While the invention has been particularly shown and described with reference to the preferred embodiments thereof, it will be understood by those skilled in the art that various changes in form and details may be made without departing from the spirit and scope of the invention.

What is claimed is:

1. A method for forming a laser accessible fuse in an integrated circuit comprising:
    (a) providing a silicon wafer having integrated circuit devices and a first insulative layer;
    (b) patterning a layer of fusible material on said first insulative layer to form a fuse with a rupture zone;
    (c) depositing a silicon oxide layer on said wafer;
    (d) patterning a polysilicon layer over said silicon oxide layer to form a first plate overlying said rupture zone;
    (e) depositing a second insulative layer over said wafer;
    (f) forming conductive contacts to said fuse on through openings in said second insulative layer and said silicon oxide layer; whereby said rupture zone is connected between, and in electrical series with, at least two of said conductive contacts;
    (g) patterning a first metal layer having a superjacent first anti reflective coating, on said second insulative layer to form a first interconnective wiring level to said devices and said fuse, and a second plate, concentric with said first plate overlying said rupture zone;
    (h) depositing a third insulative layer over said wafer;
    (i) patterning said third insulative layer and penetrating said first anti reflective coating, to form via openings and an access opening which exposes said second plate;
    (j) patterning a second metal layer having a superjacent second anti reflective coating, on said third insulative layer to form bonding pads connected to said interconnective wiring through vias in said third insulative layer, while simultaneously removing both said second metal layer and said second plate in said access opening;
    (k) depositing a passivation layer on said wafer;
    (l) patterning said passivation layer and said anti-reflective coating by anisotropically etching, with a first etchant gas mixture and a first silicon oxide-to-polysilicon selectivity, to exposed said bonding pads and a region within said window opening, penetrating said third and said second insulative layers, stopping on said first plate; and
    (m) after step (l), without breaking vacuum and with a second gas mixture and a second silicon oxide-to-polysilicon selectivity, etching through said first plate and partially into said second insulative layer, leaving a final thickness of said second insulative layer over said rupture zone.

2. The method of claim 1 wherein said fusible material is polysilicon.

3. The method of claim 1 wherein said first and said second metal layers are selected from the group consisting of aluminum, an aluminum alloy, tungsten, a tungsten alloy, copper, and a copper alloy.

4. The method of claim 1 wherein said insulative layers are selected from the group consisting of silicon oxide, silicon oxynitride, a phosphosilicate glass and a borophosphosilicate glass.

5. The method of claim 1 wherein said first and second anti-reflective coating are selected from the group consisting of TiN, TaN, and silicon oxynitride.

6. The method of claim 1 wherein said silicon oxide layer is between about 0.4 and 0.5 microns thick.

7. The method of claim 1 wherein said passivation layer comprises a laminar structure consisting of a bottom layer of silicon oxide between about 0.4 and 0.7 microns thick, an intermediate layer of silicon nitride between about 0.4 and 0.7 microns thick, and a top layer of polyimide between about 8 and 12 microns thick.

8. The method of claim 1 wherein said passivation layer comprises a laminar structure consisting of a layer of silicon oxide between about 0.4 and 0.7 microns thick, and a layer of silicon nitride between about 0.4 and 0.7 microns thick on said silicon oxide layer.

9. The method of claim 1 wherein said first etchant gas contains fluorocarbons.

10. The method of claim 1 wherein said first silicon oxide-to-polysilicon selectivity is greater than 7 to 1 or thereabout.

11. The method of claim 1 wherein said second etchant gas contains fluorocarbons and $SF_6$.

12. The method of claim 1 wherein said second silicon oxide-to-polysilicon selectivity is 1 to 1 or thereabout.

13. The method of claim 1 wherein said final thickness is between about 0.2 and 0.5 microns.

* * * * *